(12) United States Patent
Bangalore Umesh et al.

(10) Patent No.: US 12,027,352 B2
(45) Date of Patent: Jul. 2, 2024

(54) APPARATUS FOR GENERATING MAGNETIC FIELDS ON SUBSTRATES DURING SEMICONDUCTOR PROCESSING

(71) Applicant: Applied Materials, Inc., Santa Clara, CA (US)

(72) Inventors: Suhas Bangalore Umesh, Sunnyvale, CA (US); Kishor Kumar Kalathiparambil, Santa Clara, CA (US); Goichi Yoshidome, Albany, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 246 days.

(21) Appl. No.: 17/507,122

(22) Filed: Oct. 21, 2021

(65) Prior Publication Data
US 2022/0384164 A1    Dec. 1, 2022

Related U.S. Application Data

(63) Continuation-in-part of application No. 17/334,634, filed on May 28, 2021.

(51) Int. Cl.
*H01J 37/34* (2006.01)
*C23C 14/35* (2006.01)
*H01J 37/32* (2006.01)

(52) U.S. Cl.
CPC .......... *H01J 37/3452* (2013.01); *C23C 14/35* (2013.01); *H01J 37/32715* (2013.01); *H01J 2237/332* (2013.01)

(58) Field of Classification Search
None
See application file for complete search history.

(56) References Cited

U.S. PATENT DOCUMENTS

| 2,549,926 | A | | 4/1951 | Pride et al. | |
| 4,162,954 | A | * | 7/1979 | Morrison, Jr. | H01J 37/3494 204/192.12 |
| 4,842,683 | A | | 6/1989 | Cheng et al. | |
| 5,415,754 | A | * | 5/1995 | Manley | C23C 14/35 204/192.12 |

(Continued)

FOREIGN PATENT DOCUMENTS

CN    102953035 A    3/2013

OTHER PUBLICATIONS

PCT International Search Report and Written Opinion for PCT/US2022/036312 dated Oct. 13, 2022.

(Continued)

*Primary Examiner* — Jason Berman
(74) *Attorney, Agent, or Firm* — MOSER TABOA

(57) ABSTRACT

A plasma vapor deposition (PVD) chamber used for depositing material includes an apparatus for influencing ion trajectories during deposition on a substrate. The apparatus includes at least one annular support assembly configured to be externally attached to and positioned below a substrate support pedestal and a magnetic field generator affixed to the annular support assembly and configured to radiate magnetic fields on a top surface of the substrate. The magnetic field generator may include a plurality of symmetrically spaced discrete permanent magnets or may use one or more electromagnets to generate the magnetic fields.

16 Claims, 12 Drawing Sheets

(56) References Cited

U.S. PATENT DOCUMENTS

| | | |
|---|---|---|
| 5,431,874 A | 7/1995 | Gigliotti, Jr. |
| 6,067,364 A | 5/2000 | Brinkley et al. |
| 6,074,518 A | 6/2000 | Imafuku et al. |
| 6,099,706 A | 8/2000 | Hirabayashi et al. |
| 6,190,495 B1 | 2/2001 | Kubota et al. |
| 6,471,822 B1 | 10/2002 | Yin et al. |
| 6,562,189 B1 | 5/2003 | Quiles et al. |
| 6,673,716 B1 | 1/2004 | D'Couto et al. |
| 6,837,975 B2 | 1/2005 | Wang et al. |
| 7,294,224 B2 | 11/2007 | Vesci et al. |
| 7,972,489 B2 | 7/2011 | Hanawa et al. |
| 8,778,151 B2 | 7/2014 | Ikeda et al. |
| 8,919,279 B1 | 12/2014 | Bourez et al. |
| 9,281,167 B2 | 3/2016 | Nguyen et al. |
| 9,646,843 B2 | 5/2017 | Nguyen et al. |
| 10,460,968 B2 | 10/2019 | Hsu et al. |
| 10,790,180 B2 | 9/2020 | Hsu et al. |
| 2004/0112294 A1 | 6/2004 | Allen et al. |
| 2004/0121610 A1 | 6/2004 | Russel |
| 2004/0196127 A1 | 10/2004 | Perrin |
| 2005/0011757 A1 | 1/2005 | Noda |
| 2005/0116392 A1 | 6/2005 | Vesci et al. |
| 2005/0211548 A1* | 9/2005 | Gung .................. H01J 37/3455 204/192.12 |
| 2012/0152896 A1 | 6/2012 | Zhou et al. |
| 2012/0298303 A1 | 11/2012 | Ikeda et al. |
| 2013/0101749 A1* | 4/2013 | Yang .................. H01J 37/3405 427/523 |
| 2016/0163591 A1 | 6/2016 | Ishizaka et al. |
| 2019/0244754 A1 | 8/2019 | Yang et al. |
| 2020/0135434 A1 | 4/2020 | Nakagawasai et al. |
| 2021/0074511 A1 | 3/2021 | Yokota |

OTHER PUBLICATIONS

International Search Report for PCT/US2022/026290, dated Aug. 9, 2022.

* cited by examiner

APPARATUS FOR GENERATING MAGNETIC FIELDS ON SUBSTRATES DURING SEMICONDUCTOR PROCESSING

CROSS-REFERENCE TO RELATED APPLICATIONS

This application is a continuation-in-part of co-pending U.S. patent application Ser. No. 17/334,634, filed May 28, 2021, the entire contents of which are incorporated by reference herein.

FIELD

Embodiments of the present principles generally relate to semiconductor manufacturing.

BACKGROUND

During semiconductor manufacturing, layers of different materials are etched or deposited on a substrate to form semiconductor structures. In general, depositing the layers in an even or uniform fashion is highly desirable to allow fine control over the semiconductor processes. However, the inventor has observed that often, the deposition of materials in plasma vapor deposition (PVD) chambers are not highly uniform due to poor ion capture by the substrate during the deposition processes.

Accordingly, the inventor has provided an apparatus that facilitates in capturing ions on the substrate during PVD processes, leading to superior deposition performance.

SUMMARY

Apparatus for influencing ion capture on a substrate during PVD processes are provided herein.

In some embodiments, an apparatus for influencing ion trajectories onto a substrate may comprise at least one annular support assembly configured to be externally attached to and positioned below a substrate support pedestal in a vacuum space of a process chamber and a magnetic field generator affixed to the at least one annular support assembly that is configured to radiate magnetic fields on a top surface of the substrate and configured to influence angles of incidence of ions impinging on the substrate during plasma vapor deposition processes.

In some embodiments, the apparatus may further include wherein the at least one annular support assembly includes a top annular plate, a middle annular plate with a plurality of openings, and a bottom annular plate and wherein the magnetic field generator includes a plurality of discrete permanent magnets positioned within the plurality of openings of the middle annular plate and held in place by the top annular plate and the bottom annular plate, wherein the plurality of discrete permanent magnets is configured to operate at temperatures up of at least 200 degrees Celsius or higher without a loss of magnetic field strength, wherein at least one of the plurality of discrete permanent magnets is formed of a samarium cobalt material, wherein the samarium cobalt material has a maximum energy product of at least 30 MGOe, wherein the plurality of discrete permanent magnets includes 18 discrete permanent magnets spaced symmetrically apart in the at least one annular support assembly, wherein the plurality of discrete permanent magnets is each approximately 0.7 inches wide by approximately 0.7 inches deep by approximately 1.5 inches in length, wherein the annular support assembly is formed from aluminum material, wherein the magnetic field generator includes at least one electromagnet affixed to the at least one annular support assembly, wherein the at least one electromagnet is configured to have a current of up to approximately 7 amps, wherein the at least one electromagnet that is configured to provide a variable magnetic field, wherein the at least one electromagnet is configured to provide magnetic fields that can be turned on and off, wherein the magnetic field generator includes a separate inner winding and a separate outer winding, wherein each magnetic field of the separate inner winding and the separate outer winding can be individually varied, wherein the magnetic field generator is configured to alternate a polarity of each magnetic field of the separate inner winding and the separate outer winding, and/or wherein the at least one annular support assembly includes a first annular support assembly and a second annular support assembly, wherein the second annular support assembly is positioned radially outward of the first annular support assembly and wherein a first magnetic field generator of the first annular support assembly and a second magnetic field generator of the second annular support assembly are configured to be independently controlled.

In some embodiments, an apparatus for influencing ion trajectories onto a substrate may comprise at least one annular support assembly formed of an aluminum-based material and configured to be externally attached to and positioned below a substrate support pedestal, wherein the at least one annular support assembly includes a top annular plate, a middle annular plate with a plurality of openings, and a bottom annular plate and a magnetic field generator affixed to the at least one annular support assembly and configured to radiate magnetic fields on a top surface of the substrate, wherein the magnetic field generator includes a plurality of discrete permanent magnets positioned within the plurality of openings of the middle annular plate and held in place by the top annular plate and the bottom annular plate and wherein the plurality of discrete permanent magnets is configured to operate at temperatures of at least 200 degrees Celsius without a loss of magnetic field strength.

In some embodiments, the apparatus may further include wherein at least one of the plurality of discrete permanent magnets is formed of samarium cobalt material with a maximum energy product of at least 30 MGOe, and/or wherein at least one of the plurality of discrete permanent magnets is individually configured to prevent outgassing.

In some embodiments, an apparatus for influencing ion trajectories onto a substrate may comprise at least one annular support assembly formed of an aluminum-based material and configured to be externally attached to and positioned below a substrate support pedestal and a magnetic field generator affixed to the at least one annular support assembly and configured to radiate magnetic fields on a top surface of the substrate, wherein the magnetic field generator includes at least one electromagnet affixed to the at least one annular support assembly and wherein the at least one electromagnet is configured to provide a variable magnetic field.

In some embodiments, the apparatus may further include wherein the magnetic field generator includes a separate inner winding and a separate outer winding horizontally adjacent to each other and wherein each magnetic field of the separate inner winding and the separate outer winding can be individually varied and/or wherein the at least one annular support assembly includes a first annular support assembly and a second annular support assembly, wherein the second annular support assembly is positioned radially outward.

In some embodiments, an apparatus for influencing ion trajectories onto a substrate includes at least one annular support assembly configured to be externally attached to and positioned below a substrate support pedestal in a vacuum space of a process chamber, and a magnetic field generator affixed to the at least one annular support assembly that is configured to radiate magnetic fields on a top surface of the substrate and configured to influence angles of incidence of ions impinging on the substrate during plasma vapor deposition processes. The at least one annular support assembly includes a top annular plate, a middle annular plate with a plurality of openings, and a bottom annular plate. The magnetic field generator includes a plurality of discrete permanent magnets positioned within the plurality of openings of the middle annular plate and held in place by the top annular plate and the bottom annular plate. At least one discrete permanent magnet of the plurality of discrete permanent magnets extends longitudinally between the top annular plate and the bottom annular plate along a longitudinal axis.

In some embodiments, an apparatus for influencing ion trajectories onto a substrate include at least one arcuate support assembly configured to be externally attached to and positioned below a substrate support pedestal in a vacuum space of a process chamber, and a magnetic field generator affixed to the at least one arcuate support assembly that is configured to radiate magnetic fields on a top surface of the substrate and configured to influence angles of incidence of ions impinging on the substrate during plasma vapor deposition processes. The at least one arcuate support assembly includes a top arcuate plate, a middle arcuate plate with a plurality of openings, and a bottom arcuate plate. The magnetic field generator includes a plurality of discrete permanent magnets positioned within the plurality of openings of the middle arcuate plate and held in place by the top arcuate plate and the bottom arcuate plate.

In some embodiments, an apparatus for influencing ion trajectories onto a substrate include at least one support assembly configured to be externally attached to and positioned below a substrate support pedestal in a vacuum space of a process chamber, and a magnetic field generator affixed to the at least one support assembly that is configured to radiate magnetic fields on a top surface of the substrate and configured to influence angles of incidence of ions impinging on the substrate during plasma vapor deposition processes. The support assembly includes a top plate, a middle plate with a plurality of openings, and a bottom plate. The magnetic field generator includes a plurality of discrete permanent magnets positioned within the plurality of openings of the middle plate and held in place by the top plate and the bottom plate. At least one discrete permanent magnet of the plurality of discrete permanent magnets extends longitudinally between the top plate and the bottom plate along a longitudinal axis extending between the top plate and the bottom plate.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
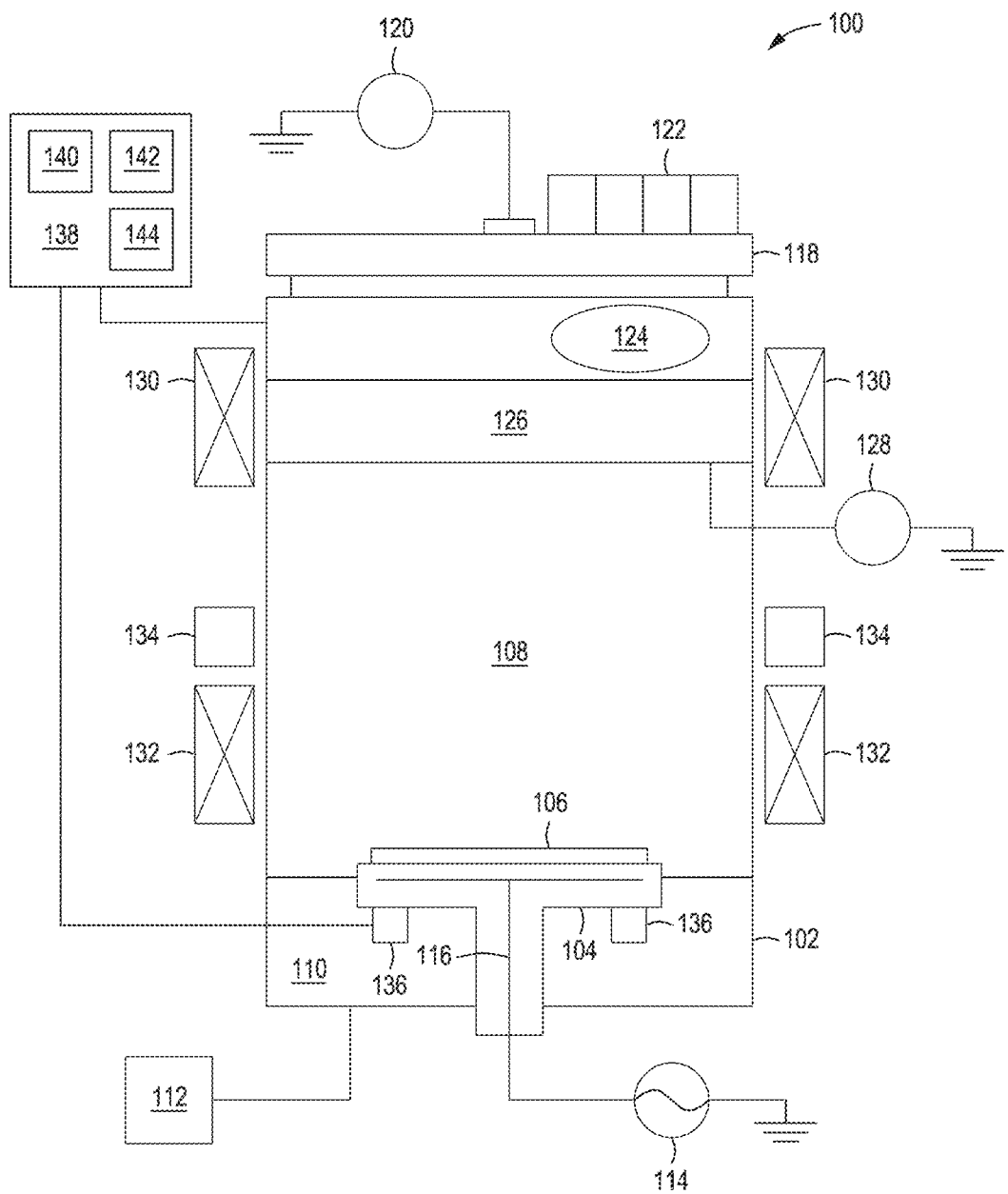
FIG. 1 depicts a cross-sectional view of a process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Ion capture at the wafer plane varies with the magnetic field strength and orientation. The apparatus of the present principles provides hardware consisting of magnetic field generators positioned below the substrate support pedestal that enable stronger normal magnetic field lines at the wafer plane. In some semiconductor chamber designs, the strength and orientation of the magnetic field is controlled by magnets positioned above the wafer plane external to the process chamber. Because the magnets are above the wafer plane, the magnets have limitations in ensuring normal B-field orientation especially at the wafer edge which results in ion loss at the wafer edge region. The apparatus of the present principles addresses the lack of normal B-field orientation at the wafer-level and provides an efficient way to enable a uniform and stronger, normal magnetic field lines across the entire wafer plane which helps in the reduction of ion loss. The manipulation of the B-field orientation may also provide improved bottom and sidewall coverage for features on the substrate during resputtering.

In some embodiments, the apparatus of the present principles uses the addition of a plurality of discrete permanent magnets below the substrate support pedestal in the vacuum space of the process chamber positioned nearer the wafer edge region, achieving a strong normal magnetic field at the wafer surface. In some embodiments, the apparatus of the present principles uses the addition of one or more electromagnets below the substrate support pedestal in the vacuum space of the process chamber positioned nearer the wafer edge region to achieve the strong normal magnetic field at the wafer surface. In some embodiments, the apparatus may provide a cost-effective enhancement to existing chamber setups which will enable better plasma vapor deposition (PVD) film properties due to increased ion flux. The apparatus of the present principles also has the advantage of offering a tuning knob to improve PVD film properties (by tuning step coverage and tuning deposition rate) through improved ion capture through customization of the apparatus and the parameters of the magnet field generators. In some embodiments using discrete permanent magnets, the apparatus has a further economic benefit in that the apparatus does not require any electrical or power integration and does not require any change in chamber software to operate the apparatus. The apparatus may also afford greater tunability of other electromagnets external to the process chamber that are used in conjunction with the apparatus to further enhance film deposition quality.

In a view 100 of FIG. 1, a process chamber 102 that may incorporate the apparatus of the present principles is depicted. The process chamber 102 has a substrate support pedestal 104 that provides a surface to support a substrate 106 during processing. The process chamber 102 includes a processing volume 108 in which the substrate 106 is processed and a non-processing volume 110 that is in fluid contact with a vacuum pump 112 and the processing volume 108. The vacuum pump 112 allows the processing volume 108 to be pumped down to operate in a vacuum during processing. The substrate support pedestal 104 may include an electrode 116 that is connected to an RF power supply 114 for biasing the substrate 106 during processing. The process chamber 102 may also include an upper electrode 118 that is electrically connected to a plasma DC power supply 120. The process chamber 102 may also include a controller 138. The controller 138 controls the operation of the process chamber 102 using direct control or alternatively, by controlling the computers (or controllers) associated with the process chamber 102.

In operation, the controller 138 enables control of the magnetic fields, data collection, and feedback from the respective apparatus and systems to optimize performance of the process chamber 102. The controller 138 generally includes a Central Processing Unit (CPU) 140, a memory 142, and a support circuit 144. The CPU 140 may be any form of a general-purpose computer processor that can be used in an industrial setting. The support circuit 144 is conventionally coupled to the CPU 140 and may comprise a cache, clock circuits, input/output subsystems, power supplies, and the like. Software routines, such as ion trajectory tuning methods using the apparatus of the present principles may be stored in the memory 142 and, when executed by the CPU 140, transform the CPU 140 into a specific purpose computer (controller 138). The software routines may also be stored and/or executed by a second controller (not shown) that is located remotely from the process chamber 102.

The memory 142 is in the form of computer-readable storage media that contains instructions, when executed by the CPU 140, to facilitate the operation of the semiconductor processes and equipment. The instructions in the memory 142 are in the form of a program product such as a program that implements deposition methods and the like that include the performance parameters of the apparatus to properly tune the depositions. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions, such as ion trajectory tuning methods, are aspects of the present principles.

Figure 14:
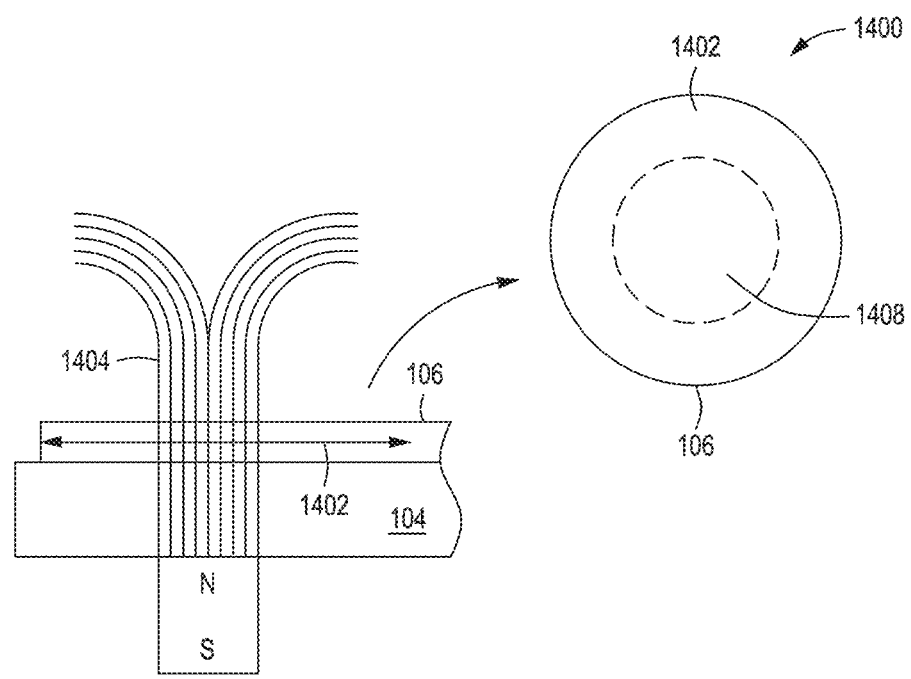
FIG. 14 depicts a cross-sectional and top-down view of a substrate in accordance with some embodiments of the present principles.

A magnetron assembly 122 may also be used to control plasma 124 generated in the process chamber 102 to increase ionization of the plasma. In some process chambers, an optional collimator 126 may be used to filter ions and is electrically connected to a collimator DC power supply 128. Other process chambers do not use a collimator. A first external electromagnet assembly 130 may be used in conjunction with the optional collimator 126 to additionally influence ion trajectories. A second external electromagnet assembly 132 may also be used closer to the substrate support pedestal 104 to further influence ion trajectories. In some instances, an external permanent magnet assembly 134 may be disposed between the first external magnet assembly and the second external electromagnet assembly 132. Despite the multiple assemblies used to influence ion trajectories, the inventor has observed that deposition thicknesses away from the center of the substrates are typically thinner than the central portions of the substrate due to the ion trajectories being less than perpendicular (normal) to the top surface of the substrate. The inventor has found that if one or more magnetic field generators 136 are positioned below the substrate support pedestal 104 such as, for example, in vacuum space, the film uniformity is increased, especially at the edge region 1402 of the substrate 106 as depicted in a view 1400 of FIG. 14.

In some embodiments, the one or more magnetic field generators 136 provide a north pole up configuration (other configurations may use south pole up). The magnetic fields 1404 (B-fields) impinge upon the substrate 106 nearer the edge region 1402 and less in a central region 1408. In some embodiments using a plurality of discrete permanent magnets, the strength of the magnetic fields of the one or more magnetic field generators 136 may be adjusted by using different magnetic materials with varying magnetic properties to increase or decrease the magnetic fields, decreasing or increasing the volume of the magnetic material to decrease or increase the strength of the magnetic fields, respectively, and/or decreasing or increasing the number of the permanent magnets to decrease or increase the number and placement of the magnetic fields, respectively. As film uniformity is highly desirable, placing the permanent magnets symmetrically around the bottom surface of the substrate support pedestal 104 aids in increasing the deposition uniformity.

In some embodiments, the permanent magnets may be formed of a magnetic material with a maximum energy product of at least 30 MGOe (Mega (Millions of) Gauss Oersted) and preferably at least 32 MGOe. A plurality of discrete permanent magnets forming the one or more magnetic field generators 136 may be symmetrically spaced around the substrate 106 in an annular assembly to hold the permanent magnets in place. In some embodiments, 18 rectangular permanent magnets may be used to below the substrate support pedestal 104. As the volume of the magnetic material affects the strength of the permanent magnets, in some embodiments, the permanent magnets may have a rectangular shape (see FIG. 7) of approximately 0.5 inches to approximately 0.75 inches and a height of approximately 1.0 inches to approximately 2.0 inches. In some embodiments, the rectangular shape of the permanent magnets may be approximately 0.7 inches by approximately 0.7 inches by approximately 1.5 inches.

In some embodiments using one or more electromagnets, the strength of the magnetic fields of the one or more magnetic field generators 136 may be adjusted by flowing different levels of current through one or more windings of the one or more electromagnets of the one or more magnetic field generators. In some embodiments, the current direction may also be reversed to further control the magnetic fields and/or one or more windings may flow current in opposite directions with the same level of current or with different levels of current to further control the magnetic fields on the top surface of the substrate 106. The current flow may also be turned OFF and ON and/or pulsed to further affect the generated magnetic fields.

Figure 2:
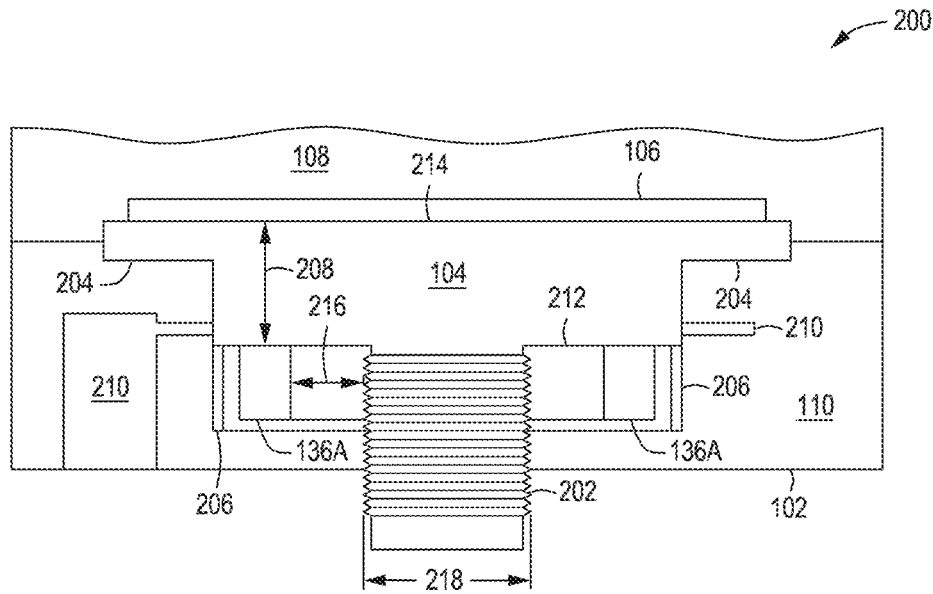
FIG. 2 depicts a cross-sectional view of a substrate support pedestal with an annular support assembly with permanent magnets that form a magnetic field generator in accordance with some embodiments of the present principles.
Figure 3:
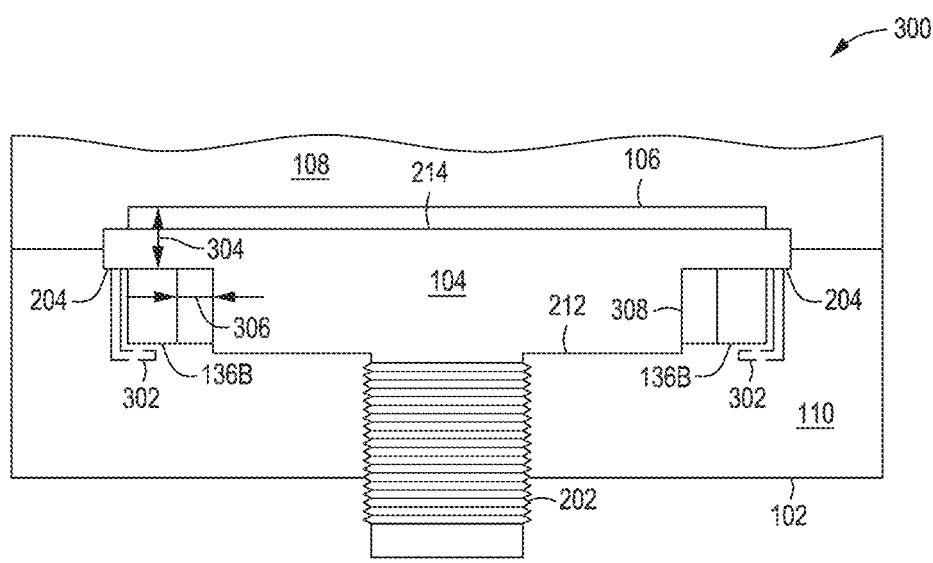
FIG. 3 depicts a cross-sectional view of a substrate support pedestal with an annular support assembly with permanent magnets that form a magnetic field generator in accordance with some embodiments of the present principles.

As depicted in a graph 1500A of FIG. 15, a gauss level plot 1504 over a radius 1502 of a substrate shows a first gauss level 1506 over the substrate without magnetic field generation below the substrate versus a second gauss level 1508 over the substrate with magnetic field generation below the substrate (in a position as depicted in FIG. 2). The magnetic field generation below the substrate support pedestal improves the gauss level above the position of the magnetic field generator of the substrate by approximately 30 to approximately 45 gauss or more. The gauss level improvement is influenced by the thickness of the substrate support pedestal which dictates the distance between the magnetic field generators below the support pedestal and the top surface of the substrate. As described above, in some embodiments using discrete magnets, the number of magnets, the strength of the magnet material, and/or the total volume of the magnetic material and can be tuned accordingly using the parameters. In some embodiments using electromagnets, the amount of current, the direction of the current, and/or effect of differing currents and direction on adjacent windings of an electromagnet can be used to tune the generated magnetic field on the top surface of the substrate. In some embodiments where the magnetic field generator is moved further out towards the edge of the substrate as depicted in FIG. 3, the peaks 1518 of the gauss levels will move outward 1520 towards the edges of the substrate. If the magnetic field strength is maintained compared to the position as depicted in FIG. 2, the position of FIG. 3 will also have an increase in peak gauss level as the magnetic field generator is closer to the substrate.

Figure 15:
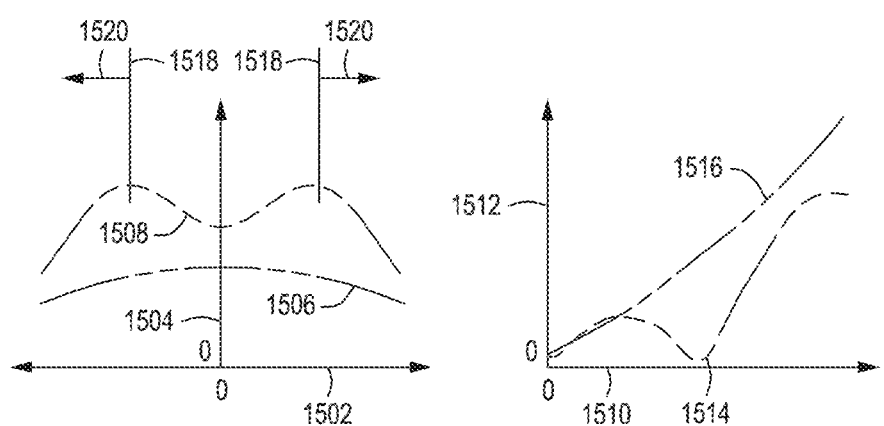
FIG. 15 depicts graphs of effects of magnetic fields on ion trajectories in accordance with some embodiments of the present principles.

The inventor has also discovered, as depicted in a graph 1500B of FIG. 15, (the x-axis 1510 is the radial distance from the center of the substrate and y-axis 1512 is the delta angle compared to normal of the ions impinging on the top surface of the substrate) that the angle of impingement of the ions is further from normal 1516 towards the edges of the substrate. By incorporating the present apparatus, the angle of impingement of the ions during deposition near the position of the magnetic field generator is more normalized 1514, increasing deposition uniformity. The more normalized the ion angle of impingement, the more ions are captured at the surface of the substrate. The less normalized the ion angle of impingement, the more ions that are lost, reducing deposition. As the B-fields become stronger and more normalized, the ion trajectories will also become more normalized, improving deposition quality by increasing the deposition thickness through higher ion capture at the substrate surface. The magnetic field generator position below the substrate support pedestal can be adjusted to provide maximum effect at a desired substrate position.

FIG. 2 depicts a cross-sectional view 200 of the substrate support pedestal 104 with an annular support assembly 136A with permanent magnets that forms a magnetic field generator in accordance with some embodiments. The annular support assembly 136A is attached to a lower surface 212 of the substrate support pedestal 104 that is parallel to a top surface 214 of the substrate support pedestal 104. The annular support assembly 136A encircles the bellows 202 and is spaced a distance 216 from the bellows 202 in order to allow proper operation of the substrate support pedestal 104 as the diameter 218 of the bellows 202 expands as the bellows 202 contracts. As discussed further below for FIGS. 4-7, the annular support assembly 136A contains a plurality of discrete permanent magnets that form a magnetic field generator under the substrate support pedestal 104. The magnetic fields of the plurality of discrete permanent magnets travel through the substrate support pedestal 104 for a distance 208 before the magnetic fields can influence ion trajectories above the substrate 106 (see, e.g., FIG. 14). The inventor has discovered that the plurality of discrete permanent magnets should have a minimum MGOe of approximately 30, and preferably at least 32, to provide a magnetic field that can traverse through the substrate support pedestal 104 and still influence ion trajectories on the substrate 106 during PVD depositions.

Because the inventor has observed that PVD depositions are thicker in the central region of the substrate 106, placement of the magnetic field generator (annular support assembly 136A with the plurality of discrete permanent magnets) may be most beneficial if placed radially outward of the center of the substrate 106 nearer the edge region of the substrate 106. In some embodiments, other apparatus in the process chamber 102 such as, for example, a hoop lift 210 may prevent placement of the magnetic field generator on an outer flange area 204 due to clearance issues between the substrate support pedestal 104 and the hoop lift 210. In such cases, the magnetic field generator may be placed radially outward so as to influence ion trajectories near the edge regions of the substrate 106 while still maintaining clearance under the substrate support pedestal 104.

The inventor has also observed that heat has a detrimental effect on magnetic fields of the plurality of discrete permanent magnets in the magnetic field generator. The heating of the permanent magnets may occur through conduction as the magnetic field generator is attached to the substrate support pedestal 104 which is heated by plasma generated above the substrate support pedestal 104. The heating may also occur through radiation from heating lamps (not shown) oriented below the substrate plane in the process chamber 102 (used, e.g., for removing moisture from the substrate 106). In some embodiments, a heat shield 206 may surround the outer perimeter of the annular support assembly 136A to reduce the effects of radiated heat from the heating lamps (not shown). The inventor has found that the magnetic material used for the plurality of discrete permanent magnets should maintain a strong magnetic field for temperatures of at least approximately 200 degrees Celsius or higher to effectively influence ion trajectories in the process chamber 102 during PVD depositions. In some embodiments, the magnetic material is a samarium cobalt-based material due to the samarium cobalt-based material having an operational temperature range above 200 degrees Celsius while producing a strong magnetic field above 30 MGOe.

FIG. 3 depicts a cross-sectional view 300 of a substrate support pedestal 104 with an annular support assembly 136B with permanent magnets that forms a magnetic field generator in accordance with some embodiments. In a process chamber 102 where no interference exists with other apparatus below the substrate support pedestal 104, the magnetic field generator can be positioned further radially outward, for example, on the outer flange area 204 to more effectively influence ion trajectories in the edge region of the substrate 106. Another advantage of placing the magnetic field generator in the outer flange area 204, in the example, is the distance 304 to the substrate surface is much less than the distance 208 of the position in FIG. 2, increasing the magnetic field and providing an increase in ion trajectory influence for a similar magnetic field strength. The annular support assembly 136B is spaced a distance 306 from a sidewall 308 of the substrate support pedestal in order to reduce heat conduction from the substrate support pedestal 104.

In some embodiments, the annular support assembly 136B may be placed radially outward as far as possible to enhance deposition in the edge region of the substrate 106. As described above for FIG. 2, if the process chamber 102 has heat radiation sources in proximity of the annular support assembly 136B, a heat shield 302 that surrounds an outer perimeter of the annular support assembly 136B may be used to reduce the effects of radiated heat on the plurality of discrete permanent magnets in the annular support assembly 136B. In some embodiments (as shown), the heat shield 302 may include a partial lower flange to further aid in shielding the discrete permanent magnets from radiated heat positioned lower and slightly beneath the annular support assembly 136B in the process chamber 102. As one skilled in the art can appreciate, a combination of the annular support assembly 136A and the annular support assembly 136B may be incorporated on the substrate support pedestal 104 of the process chamber 102, providing a higher level of control of the magnetic fields and ion trajectories to further influence the deposition on the substrate 106.

Figure 4:
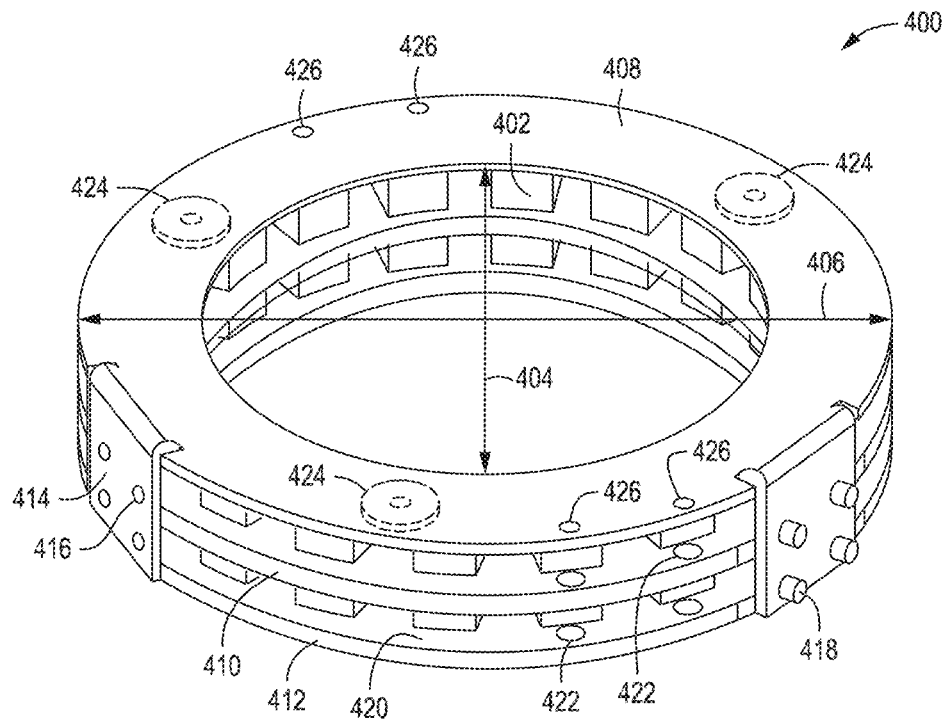
FIG. 4 depicts an isometric view of an annular support assembly with permanent magnets that form a magnetic field generator in accordance with some embodiments of the present principles.

FIG. 4 depicts an isometric view of an annular support assembly 400 with permanent magnets 402 that forms a magnetic field generator in accordance with some embodiments. In some embodiments, the inner diameter 404 of the annular support assembly 400 is greater than the outer diameter of the bellows 202 of the substrate support pedestal 104 to allow for proper operation of the substrate support pedestal 104. In some embodiments, the inner diameter 404 of the annular support assembly 400 is greater than a sidewall 308 of the outer flange area 204 of the substrate support pedestal 104. In some embodiments, the outer diameter 406 of the annular support assembly 400 may be approximately 3 inches to approximately 4 inches greater than the inner diameter 404 to accommodate for the depth of the permanent magnets 402. The permanent magnets 402 are distributed symmetrically around the annular support assembly 400 to create a symmetrical magnetic field on the substrate 106. The annular support assembly 400 of FIG. 4 is one embodiment and one skilled in the art will understand that while other annular support assemblies may hold the plurality of discrete permanent magnets in a different fashion, the annular support assembly will still operate as a magnetic field generator of the present principles.

In some embodiments, the annular support assembly 400 has a first annular ring 412 (e.g., a bottom annular plate) that is flat and provides a support surface 420 on which the plurality of discrete permanent magnets may rest. The support surface 420 may also have recesses (described below) that hold each individual permanent magnet in place. The first annular ring 412 may be formed from 6061 aluminum and the like. A second annular ring 410 (e.g. a middle annular plate) is flat and has a plurality of openings in which the plurality of permanent magnets can be placed. The second annular ring 410 provides additional stability to the permanent magnets and prevents the permanent magnets from moving in the annular support assembly 400. In some embodiments, the second annular ring 410 is optional. A third annular ring 408 (e.g., a top annular plate) is flat and is used to retain the top of the plurality of permanent magnets. In some embodiments, the third annular ring 408 may be formed of 5052 aluminum material. In some embodiments, side supports 414 may be formed separate from the third annular ring 408 or may be formed as part of the third annular ring 408 and bent downward to provide vertical support for the first annular ring 412, the second annular ring 410, and the third annular ring 408. The first annular ring 412 may be held by the side supports 414 via fasteners 418 such as, for example but not limited to, screws or bolts that go through the openings 416 in the side supports 414 and into a side of the first annular ring 412 and into a side of the second annular ring 410.

In some embodiments (not shown), additional openings in the side supports 414 allow fasteners 418 to support the third annular ring 408. In the example depicted, the third annular ring 408 and the side support 414 are formed from a single sheet of material. Access holes 422 may be provided in the first annular ring 412 and the second annular ring 410 to allow a fastening tool to insert a fastener (not shown) into one or more mounting holes 426 to attach the annular support assembly 400 to the underside of the substrate support pedestal 104. The access holes 422 are larger in diameter than the one or more mounting holes 426 to allow the fastener to pass completely through the access holes 422 and into the one or more mounting holes. The one or more mounting holes 426 have a diameter less than a head of a fastener to allow retention of the annular support assembly 400 to the underside of the substrate support pedestal 104.

In some embodiments, a thermal isolator 424 may be used to reduce conductive heat transfer from the substrate support pedestal 104 to the annular support assembly 400 and into the permanent magnets 402. The thermal isolator 424 may include one or more isolation pads (shown) that mount between the top surface of the third annular ring 408 and the bottom surface of the substrate support pedestal 104. The thermal isolator 424 provides a thermal break between the substrate support pedestal 104 and the annular support assembly. The thermal isolator 424 may also be a single layer of thermal isolation material (not shown) that is disposed between the top surface of the third annular ring 408 and the bottom surface of the substrate support pedestal 104. In some embodiments, the thermal isolator 424 may be formed from a ceramic material or other thermal barrier materials. The shape of the thermal isolator 424 may vary such as circular (shown), rectangular, and/or annular and the like. Although depicted with an annular support assembly containing permanent magnets, the thermal isolator 424 may also be used with annular support assemblies containing electromagnets (described below) as well.

Figure 5:
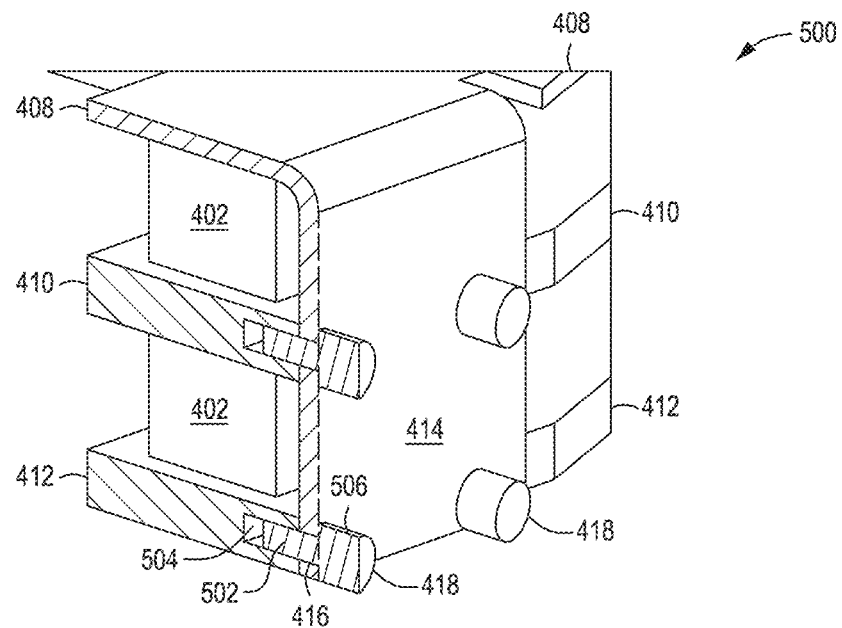
FIG. 5 depicts an isometric view of a portion of the annular support assembly with permanent magnets in accordance with some embodiments of the present principles.
Figure 6:
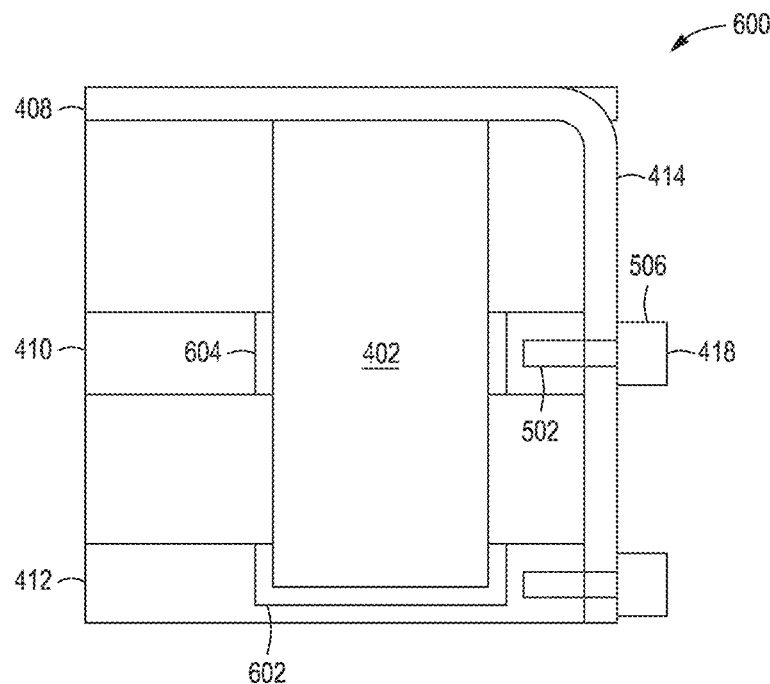
FIG. 6 depicts a cross-sectional view of an annular support assembly with permanent magnets in accordance with some embodiments of the present principles.

FIG. 5 depicts an isometric view of a portion 500 of the annular support assembly 400 with permanent magnets 402 in accordance with some embodiments. In some embodiments, the fasteners 418 have a tightening portion 502 that protrudes through the openings 416 and into a threaded hole 504 in the first annular ring 412 and the second annular ring 410. A head 506 of the fastener 418 retains the side supports 414 to the first annular ring 412 and the second annular ring 410. FIG. 6 depicts a cross-sectional view of an annular support assembly 600 with permanent magnets 402 in accordance with some embodiments. In some embodiments, a recess 602 in the first annular ring 412 may be oversized to provide some tolerance for differing permanent magnet dimensions. Similarly, an opening 604 in the second annular ring 410 may also be oversized to provide some tolerance for differing permanent magnet dimensions. In some embodiments, the recess 602 and/or the opening 604 may be oversized by approximately 0.010 inches in all dimensions compared to a specified or design size of a permanent magnet. By being oversized, variances in the dimensions of the permanent magnets can be accounted for without requiring additional machining or costly high tolerance materials or parts.

Figure 7:
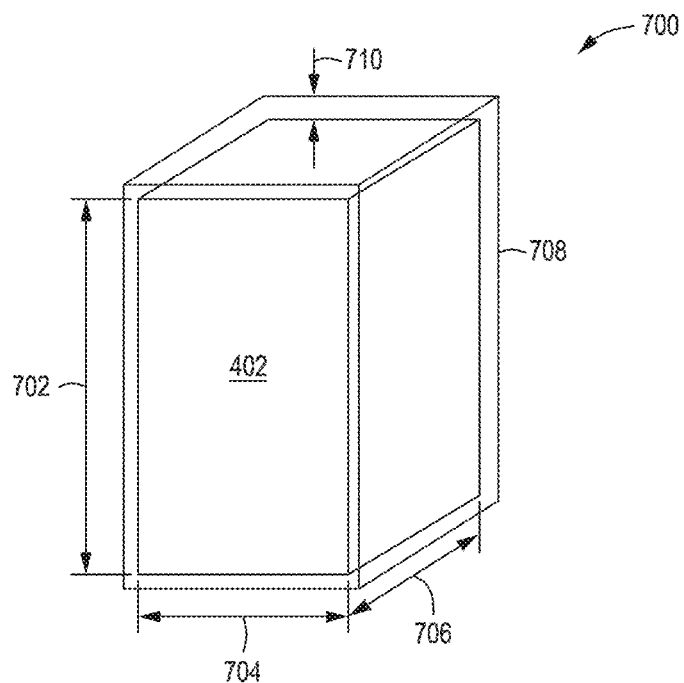
FIG. 7 depicts an isometric view of a permanent magnet in accordance with some embodiments of the present principles.

FIG. 7 depicts an isometric view 700 of a permanent magnet 402 in accordance with some embodiments. As discussed above, the volume of the magnetic material affects the strength of the permanent magnets. In some embodiments, the permanent magnets 402 may have a rectangular shape of approximately 0.5 inches to approximately 0.75 inches for a width 704 and a depth 706 and a height 702 of approximately 1.0 inches to approximately 2.0 inches. In some embodiments, the rectangular shape of the permanent magnets may be approximately 0.7 inches in width 704 by approximately 0.7 inches in depth 706 by approximately 1.5 inches in height 702. The inventor observed that when the permanent magnets 402 were subjected to processing in a process chamber the permanent magnets 402 would outgas, causing increased chamber background pressure and impurities in the process chamber. The magnetic material is typically formed by sintering one or more materials together which leaves gaps or spaces in the material, leading to outgassing of the sintered materials when subjected to heat.

To eliminate or reduce the outgassing of the magnetic material of the permanent magnets 402, the permanent magnets 402 may have an optional encapsulation material 708 to encase the permanent magnets 402. The optional encapsulation material 708 should be impermeable to any gases produced by the magnet material and capable of withstanding temperatures of at least approximately 200 degrees Celsius. In some embodiments, the optional encapsulation material 708 may have a thickness 710 from approximately 0.010 inches thick to approximately 0.100 inches thick. In some embodiments, the optional encapsulation material 708 may be a non-outgassing material that forms a structure in which the permanent magnets 402 are placed into and/or may be a coating that is applied (e.g., non-outgassing sprayed or painted coatings, etc.) directly onto exterior surfaces of the permanent magnets 402. In some embodiments, the optional encapsulation material 708 may be a wrapping of a non-outgassing material, wrapped or applied (e.g., via non-outgassing adhesives, etc.) to exterior surfaces of the permanent magnets 402. In some embodiments, the optional encapsulation material 708 may a non-ferrous plating formed by a plating process.

Figure 16A:
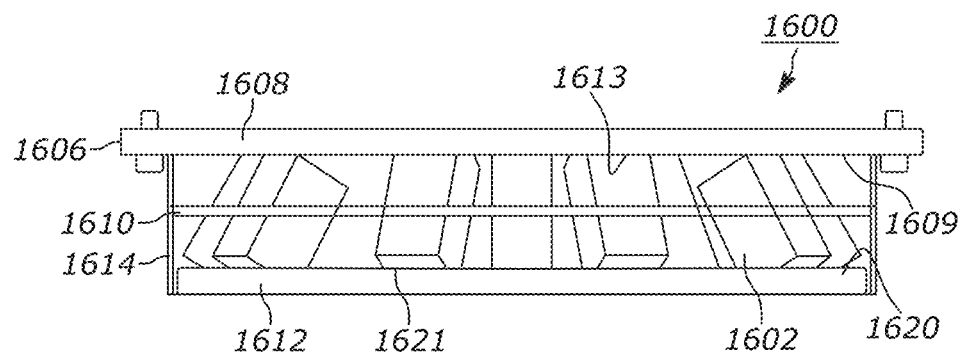
FIG. 16A depicts a plan view of an annular support assembly with permanent magnets that form a magnetic field generator in accordance with some embodiments of the present principles.
Figure 16B:
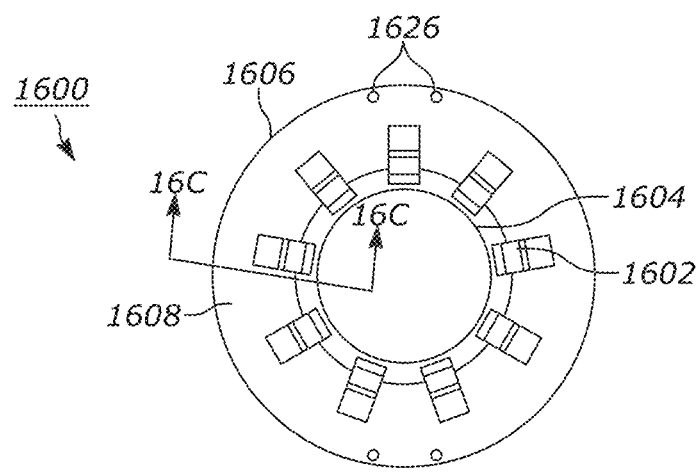
FIG. 16B depicts a side view of the annular support assembly shown in FIG. 16A in accordance with some embodiments of the present principles.

FIGS. 16A and 16B are, respectively, a plan view and a side view that depict an annular support assembly 1600 with a plurality of discrete permanent magnets 1602 that form a magnetic field generator in accordance with some embodiments. The annular support assembly 1600 is constructed similarly in many relevant respects to support assembly 400 as will become apparent from the following discussion.

Figure 16C:
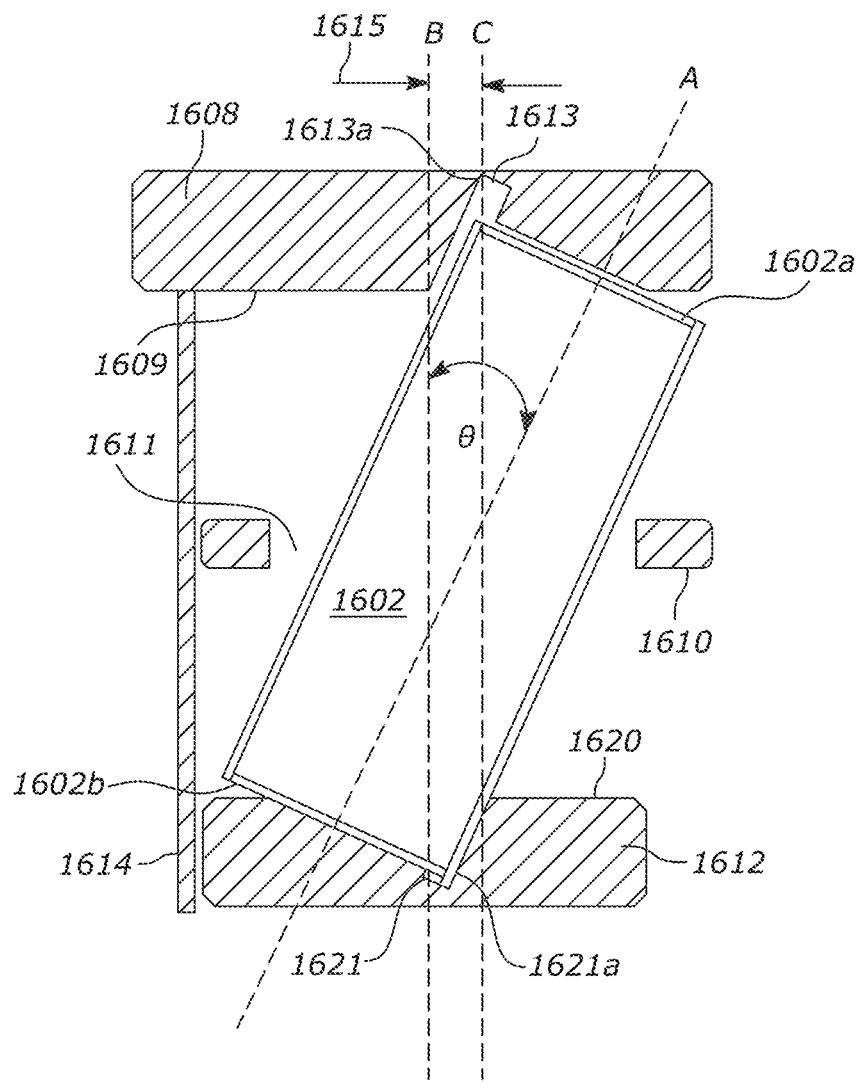
FIG. 16C depicts a cross-sectional view along section line 16C-16C of the annular support assembly of FIG. 16B in accordance with some embodiments of the present principles.

In the embodiment shown in FIGS. 16A and 16B, the annular support assembly 1600 supports a plurality of nine permanent magnets 1602, although more or fewer permanent magnets 1602 may be included. In embodiments, the construction of the permanent magnets 1602 may be the same as the permanent magnets 402 discussed above. The permanent magnets 1602 are spaced circumferentially from one another. As shown in FIG. 16C, the annular support assembly 1600 supports the permanent magnets 1602 so that one or more of the permanent magnets 1602 extend along a longitudinal axis A that is not parallel to a vertical axis B.

In some embodiments, an inner diameter 1604 (FIG. 16B) of the annular support assembly 1600 is greater than the outer diameter of the bellows 202 of the substrate support pedestal 104 to allow for proper operation of the substrate support pedestal 104. In some embodiments, the inner diameter 1604 of the annular support assembly 1600 is greater than a sidewall 308 of the outer flange area 204 of the substrate support pedestal 104. In some embodiments, an outer diameter 1606 (FIG. 16B) of the annular support assembly 1600 may be approximately 3 inches to approximately 4 inches greater than the inner diameter 1604 to accommodate for the depth of the permanent magnets 1602. In embodiments, the permanent magnets 1602 may be distributed symmetrically around the annular support assembly 1600 to create a symmetrical magnetic field on the substrate 106.

With reference to FIGS. 16A and 16C, in some embodiments, the annular support assembly 1600 has a first annular ring 1612 (which may also be referred to interchangeably as a bottom annular plate) and includes a support surface 1620 having recesses 1621 that receive and hold each individual permanent magnet 1602 in place. The first annular ring 1612 may be formed from 6061 aluminum and the like. A second annular ring 1610 (which may also be referred to interchangeably as a middle annular plate) is flat and has a plurality of openings 1611 (FIG. 16C) in which the plurality of permanent magnets 1602 can be placed. The second annular ring 1610 provides additional stability to the permanent magnets 1602 and prevents the permanent magnets 1602 from moving in the annular support assembly 1600. In some embodiments, the second annular ring 1610 is optional. A third annular ring 1608 (which may also be referred to interchangeably as a top annular plate) is flat and is used to retain the top of the plurality of permanent magnets 1602. The third annular ring 1608 includes a support surface 1609 having recesses 1613 that receive and hold each individual permanent magnet 1602 in place. In some embodiments, the third annular ring 1608 may be formed of 5052 aluminum material.

Also with reference to FIGS. 16A and 16C, in some embodiments, an optional shield 1614 may surround an outer radial side of the permanent magnets 1602. The shield 1614 may be configured to provide heat and/or radiation shielding to the permanent magnets 1602. The shield 1614 may be a solid walled cylindrical member. The shield 1614 may be formed from a metal, such as stainless steel, or from a ceramic material. The shield 1614 may be formed separately from the first annular ring 1612, the second annular ring 1610, and the third annular ring 1608. For example, the shield 1614 may be formed separately and connected to an underside (e.g., support surface 1609) of the third annular ring 1608 with fasteners, such as a screws or bolts so that the shield 1614 is suspended from the third annular ring 1608. Alternately, in embodiments, the shield 1614 may be formed as part of one or more of the first annular ring 1612, the second annular ring 1610, or the third annular ring 1608.

With reference to FIG. 16B, in some embodiments, the third annular ring 1608 has through holes 1626 for mounting the annular support assembly 1600 to the substrate support pedestal 104. The through holes 1626 are configured to permit passage of fasteners, such as screws or bolts, to connect to holes in an underside of the substrate support pedestal 104.

With reference to FIG. 16C, in embodiments, the recesses 1621 and 1613 may have an L-shaped, ninety-degree profile to retain a respective permanent magnet 1602 such that the longitudinal axis A extends at a non-zero angle θ with respect to the vertical axis B. In embodiments, the angle θ is dependent on a radial offset distance 1615 between recesses 1621 and 1613. For example, as shown in FIG. 16C, a radial position of a vertex 1621a of recess 1621 is radially offset from a radial position of a vertex 1613a of recess 1613 by an offset distance 1615 measured between vertical axis B (extending through vertex 1621a) and a vertical axis C (extending through vertex 1613a). Thus, when the permanent magnet 1602 extends through opening 1611 and is retained by recesses 1621 and 1613, the longitudinal axis A of the permanent magnet 1602 extends at the non-zero angle θ with respect to the vertical axis B. In embodiments, the angle θ may be between (but not equal to) 0 and 180 degrees such that the longitudinal axis A is not parallel with the vertical axis B. Thus, for example, in embodiments, such as that shown in FIG. 16C, the angle θ may about 30 degrees and dispose an upper end 1602a of the permanent magnet 1602 radially inwardly of a lower end 1602b of the permanent magnet 1602.

In some embodiments, either one or both of the recesses 1621 and 1613 may be oversized to provide some tolerance for differing dimensions of the permanent magnets 1602. Similarly, the opening 1611 in the second annular ring 1610 may also be oversized to provide some tolerance for differing dimensions of the permanent magnets 1602. In some embodiments, any of the recesses 1621, 1613, and the opening 1611 may be oversized in all dimensions compared to a specified or design size of a permanent magnet 1602. By being oversized, variances in the dimensions of the permanent magnets 1602 can be accommodated without requiring additional machining or costly high tolerance materials or parts.

In embodiments, the angle θ may be the same or different for each permanent magnet 1602 of the plurality of permanent magnets 1602. For example, in embodiments, the angle θ may be varied between permanent magnets 1602 to achieve a desired magnetic field on a top surface of the substrate 106. For example, in embodiments, the offset distance 1615 between a pair of recesses 1621 and 1613 can vary circumferentially around the annular support assembly 1600. Also, in embodiments, the angle θ may be manually or automatically adjustable for one or more permanent magnet 1602 of the plurality of permanent magnets 1602 to achieve a desired magnetic field on the top surface of the substrate 106. Such adjustments may be useful to compensate for non-uniformity of the magnetic field in the processing volume 108. In embodiments, the angle θ of each permanent magnet 1602 may be adjusted by one or more actuators (not shown) configured to adjust the orientation of the permanent magnet 1602. In embodiments, such actuators may be communicatively coupled to a control system (not shown) to manually or automatically control the orientation of the permanent magnet 1602. In embodiments, such a control system may be configured to receive as inputs measurements of magnetic field strength on the top surface of the substrate and be configured to dynamically adjust the angle θ of one more of the permanent magnets 1602 in response to such measurements to achieve a desired magnetic field strength on the top surface of the substrate.

Figure 17:
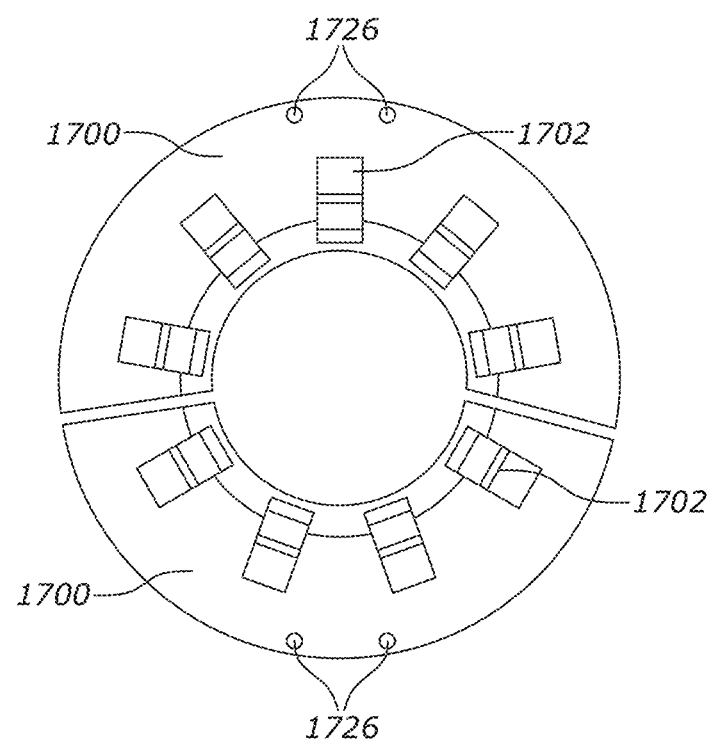
FIG. 17 depicts a plan view of a plurality of arcuate support assemblies with permanent magnets that form a magnetic field generator in accordance with some embodiments of the present principles.

In embodiments, separate arcuate support assemblies 1700 may be formed as arcuate segments, e.g., of the annular support assembly 1600, as shown in FIG. 17. Thus, as shown in greater detail in FIG. 17, each arcuate support assembly 1700 may have a bottom arcuate plate 1712, which may be an arcuate segment of the first annular ring (bottom annular plate) 1612, a middle arcuate plate 1710, which may be an arcuate segment of the second annular ring (middle annular plate) 1610, and a top arcuate plate 1708, which may be an arcuate segment of the third annular ring (top annular plate) 1608. Each arcuate support assembly 1700 supports one or more discrete permanent magnets 1702, which may, in some embodiments, be the same as the permanent magnets 1602 or 402 discussed above.

In embodiments, the top arcuate plates 1708 may have through-holes 1726 to permit passage of fasteners (e.g., screws or bolts) for connection to mating holes formed in an underside of the substrate support pedestal 104. Thus, each arcuate support assembly 1700 may be independently connected to and disconnected from the substrate support pedestal 104 without having to disassemble the substrate support pedestal 104 or the bellows 202. Thus, the arcuate support assemblies 1700 may facilitate and simplify connection and disconnection of the magnetic field generator to the substrate support pedestal 104.

While two arcuate support assemblies 1700 are shown in the embodiment of FIG. 17 arranged as an annular assembly, in other embodiments three or more arcuate support assemblies 1700 may be arranged to form an annular assembly. In some embodiments, one or more arcuate support assemblies 1700 may be connected to the substrate support pedestal 104 and used without forming a complete circular or annular assembly. Such an arrangement may be useful to account for a non-uniformity in magnetic field within the processing volume 108. Moreover, in some embodiments, each arcuate support assembly 1700 of a plurality of arcuate support assemblies 1700 may have the same arc length. In some embodiments, such as that shown in FIG. 17, at least two support assemblies 1700 may have unequal arc lengths.

Figure 18:
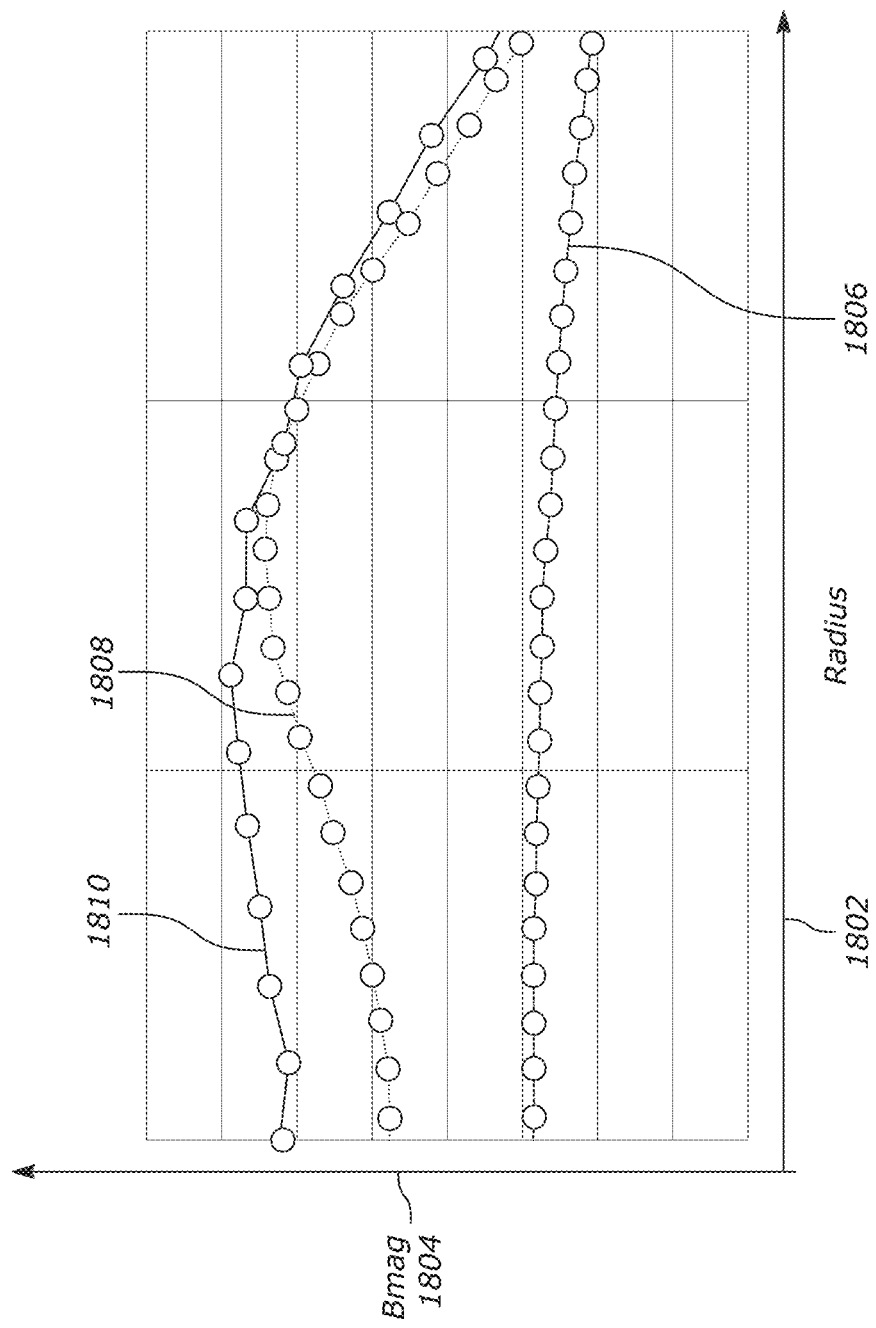
FIG. 18 depicts the effect of radial distance on magnetic field strength in accordance with some embodiments of the present principles.

In some embodiments, at least one arcuate support assembly 1700 may include an optional shield to surround an outer radial side of the permanent magnets 1702. For example, the optional shield may be an arcuate segment of the shield 1614 (FIGS. 16A and 16C) discussed above and may be formed of the same materials. As depicted in a graph of FIG. 18, a gauss level plot 1804 over a radius 1802 of a substrate shows a first gauss level 1806 over the substrate without magnetic field generation below the substrate versus a second gauss level 1808 over the substrate with magnetic field generation below the substrate (in a position as depicted in FIG. 2). In the second gauss level 1808, the magnetic field was generated by nine discrete permanent magnets having a longitudinal axis that extends parallel with a vertical axis. The gauss level plot 1804 also shows a third gauss level 1810 over the substrate with magnetic field generation below the substrate (in a position as depicted in FIG. 2) generated by nine discrete permanent magnets having a longitudinal axis that extends at a non-zero angle θ (FIG. 16C) with the vertical axis B. Specifically, the tested non-zero angle is about 30 degrees. The magnetic field generation below the substrate support pedestal improves the gauss level above the position of the magnetic field generator of the substrate. Moreover, increases in the gauss level above the second gauss level 1808 are obtained by orienting the permanent magnets at the non-zero angle θ (FIG. 16C).

Figure 8:
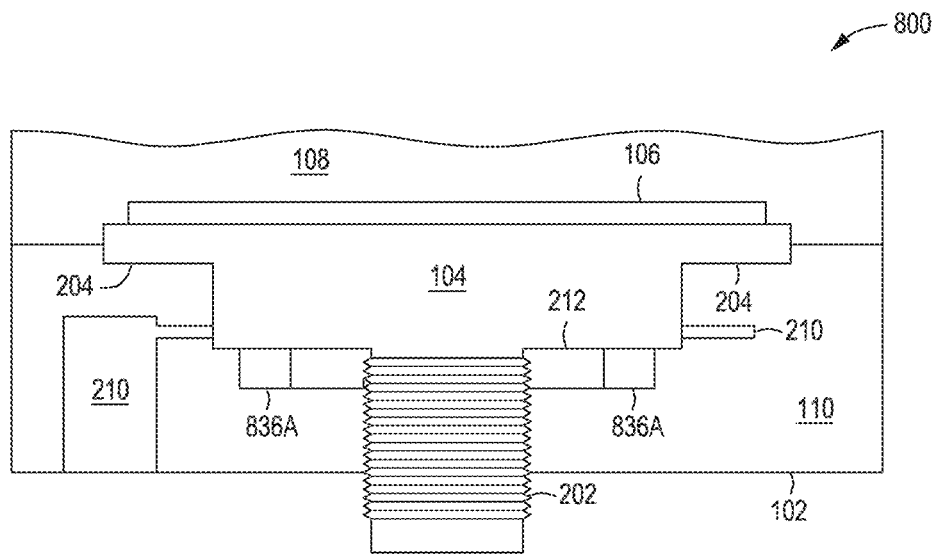
FIG. 8 depicts a cross-sectional view of a substrate support pedestal with an annular support assembly with an electromagnet that forms a magnetic field generator in accordance with some embodiments of the present principles.
Figure 9:
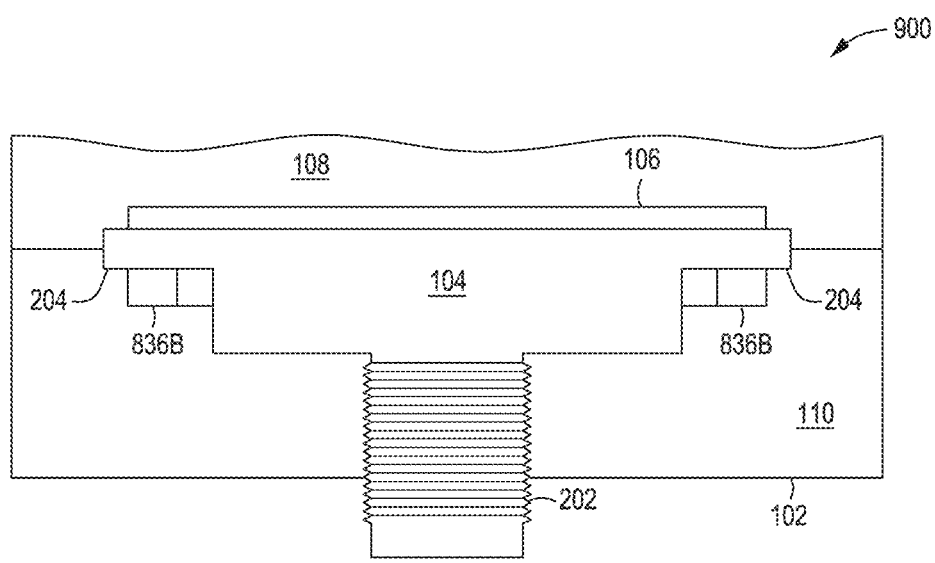
FIG. 9 depicts a cross-sectional view of a substrate support pedestal with an annular support assembly with an electromagnet that forms a magnetic field generator in accordance with some embodiments of the present principles.

FIG. 8 depicts a cross-sectional view 800 of the substrate support pedestal 104 with an annular support assembly 836A with an electromagnet that forms a magnetic field generator in accordance with some embodiments. The windings of the electromagnet are wound horizontally in a direction around the bellows 202. The annular support assembly 836A is positioned underneath and affixed externally to the substrate support pedestal 104. The electromagnet in the annular support assembly 836A forms a magnetic field generator under the substrate support pedestal 104 that produces magnetic fields above the substrate 106 to influence ion trajectories and deposition properties. FIG. 9 depicts a cross-sectional view 900 of the substrate support pedestal 104 annular support assembly 836B with an electromagnet that forms a magnetic field generator in accordance with some embodiments. The windings of the electromagnet are wound horizontally in a direction around the outer perimeter of the substrate support pedestal 104. The annular support assembly 836B is positioned underneath and affixed externally to the outer flange area 204. The annular support assembly 836B forms a magnetic field generator under the substrate support pedestal 104 that produces magnetic fields above the substrate 106 to influence ion trajectories and deposition properties. As one skilled in the art can appreciate, a combination of the annular support assembly 836A and the annular support assembly 836B may be incorporated on the substrate support pedestal 104 of the process chamber 102 to provide a higher level of control of the magnetic fields and ion trajectories to influence the deposition on the substrate 106.

Figure 10:
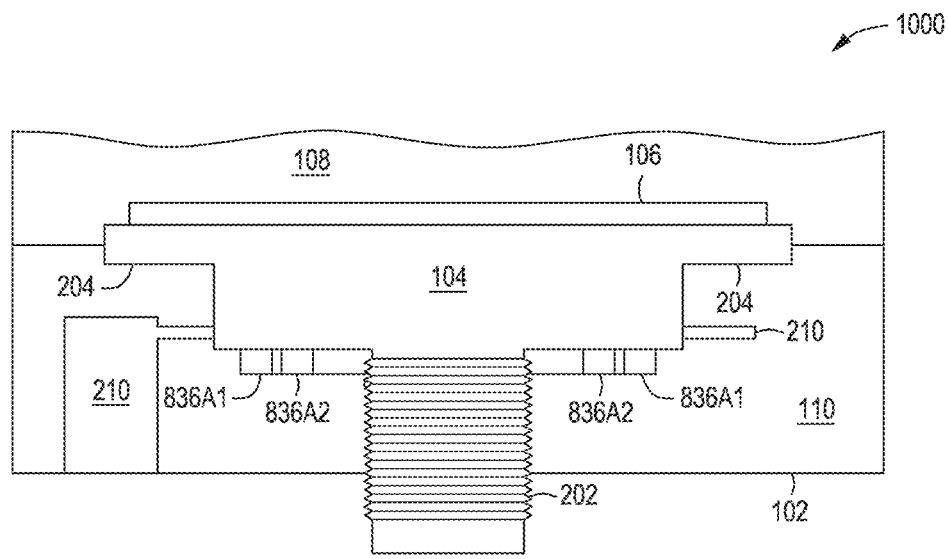
FIG. 10 depicts a cross-sectional view of a substrate support pedestal with an annular support assembly with a plurality of electromagnets that forms a magnetic field generator in accordance with some embodiments of the present principles.

FIG. 10 depicts a cross-sectional view 1000 of the substrate support pedestal 104 with an annular support assembly 836A with a plurality of electromagnets 836A1, 836A2 that forms a magnetic field generator in accordance with some embodiments. The windings of the plurality of electromagnets 836A1, 836A2 are wound horizontally in a direction around the bellows 202. The plurality of electromagnets 836A1, 836A2 are positioned underneath and affixed externally to the substrate support pedestal 104 via the annular support assembly 836. The annular support assembly 836A and the plurality of electromagnets 836A1, 836A2 form a magnetic field generator under the substrate support pedestal 104 that produces magnetic fields above the substrate 106 to influence ion trajectories and deposition properties. By using multiple electromagnets in the magnetic field generator, a higher level of control is achieved through manipulation of the amount of current flowing through each of the electromagnets as well as the direction of the current flowing through each of the electromagnets and whether current is flowing or not.

Figure 11:
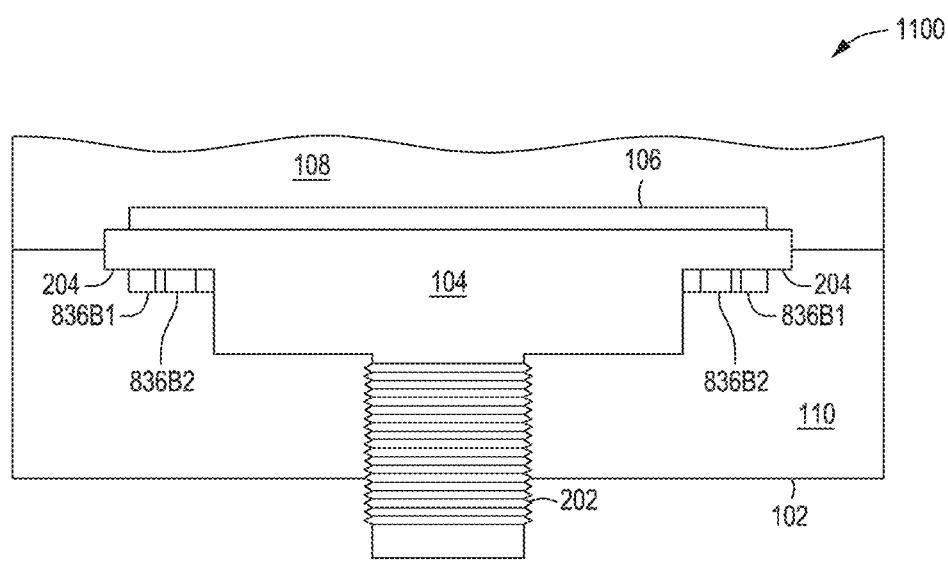
FIG. 11 depicts a cross-sectional view of a substrate support pedestal with an annular support assembly with a plurality of electromagnets that forms a magnetic field generator in accordance with some embodiments of the present principles.

FIG. 11 depicts a cross-sectional view 1100 of a substrate support pedestal 104 with an annular support assembly 836B with a plurality of electromagnets 836B1, 836B2 that forms a magnetic field generator in accordance with some embodiments. The windings of the plurality of electromagnets 836B1, 836B2 are wound horizontally in a direction around the outer perimeter of the substrate support pedestal 104. The plurality of electromagnets 836B1, 836B2 are positioned underneath and affixed externally to the outer flange area 204 via the annular support assembly 836B. The annular support assembly 836B and the plurality of electromagnets 836B1, 836B2 form a magnetic field generator under the substrate support pedestal 104 that produces magnetic fields above the substrate 106 to influence ion trajectories and deposition properties. By using multiple electromagnets in the magnetic field generator, a higher level of control is achieved through manipulation of the amount of current flowing through each of the electromagnets as well as the direction of the current flowing through each of the electromagnets and whether or not the current is flowing. As one skilled in the art can appreciate, a combination of the plurality of electromagnets 836A1, 836A2 in the annular support assembly 836A and the plurality of electromagnets 836B1, 836B2 in the annular support assembly 836B may be incorporated on the substrate support pedestal 104 of the process chamber 102 to provide an even higher level of control of the magnetic fields and ion trajectories to influence the deposition on the substrate 106.

Figure 12:
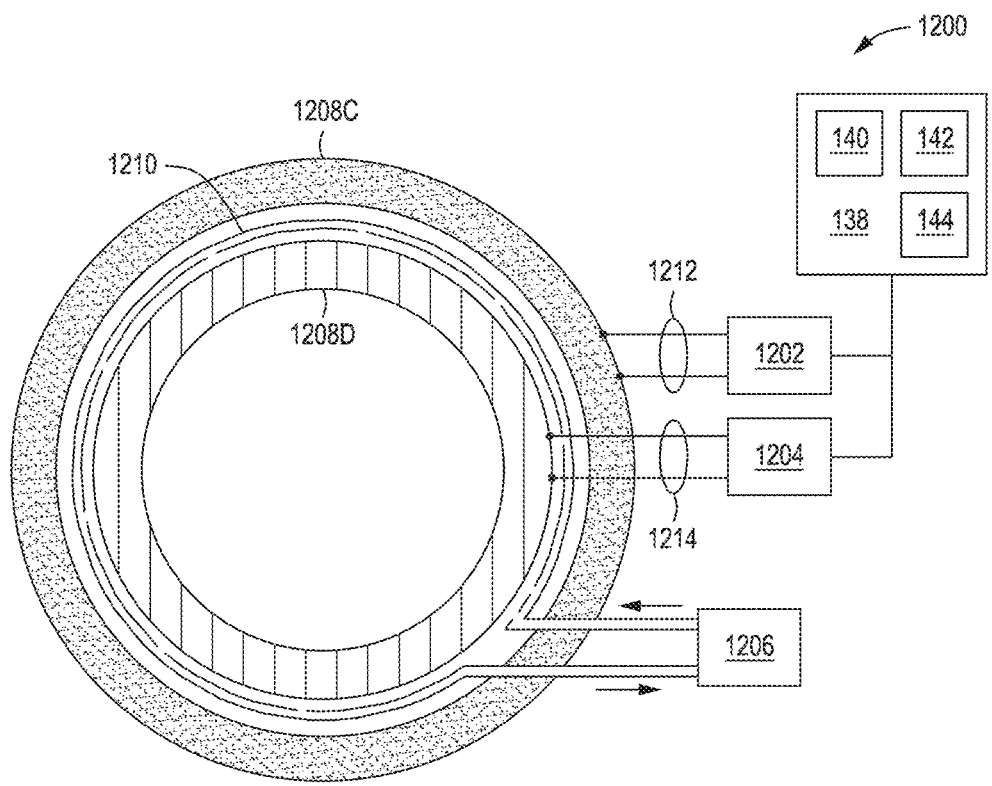
FIG. 12 depicts a top-down view of a plurality of electromagnets that form a magnetic field generator in accordance with some embodiments of the present principles.

FIG. 12 depicts a top-down view 1200 of a first electromagnet 1208C and a second electromagnet 1208D from an annular support assembly that forms a magnetic field generator in accordance with some embodiments. The plurality of electromagnets may be positioned as depicted in FIG. 10 and/or FIG. 11. The first electromagnet 1208C has at least one winding that is connected at one end to a first power supply 1202 and connected at another end to the first power supply 1202 via electrical connections 1212. The second electromagnet 1208D has at least one winding that is connected at one end to a second power supply 1204 and connected at another end to the second power supply 1204 via electrical connections 1214. In some embodiments, the first power supply 1202 and the second power supply 1204 may be a single power supply with multiple connections for providing the same and/or different currents to the first electromagnet 1208C and the second electromagnet 1208D. In some embodiments, the first power supply 1202 and the second power supply 1204 may be connected to and controlled by the controller 138 of the process chamber 102. The controller 138 may adjust the current level and/or current direction in the first power supply 1202 and the second power supply 1204 individually and/or in unison to alter the magnetic fields produced based on a process recipe or based on tuning for a specific type of chamber, etc. The controller 138 may also turn the power supplied to the first electromagnet 1208C and to the second electromagnet 1208D ON or OFF individually or in unison to further control the generated magnetic fields. The controller 138 may also pulse the power supplied to the first electromagnet 1208C and to the second electromagnet 1208D individually or in unison to further control the generated magnetic fields.

Figure 13:
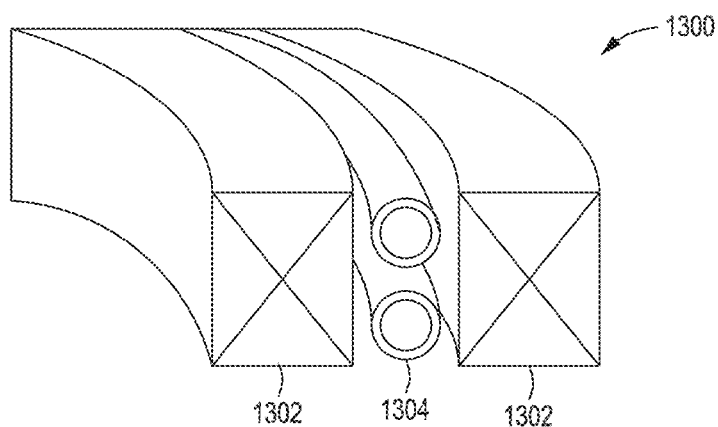
FIG. 13 depicts an isometric view of a portion of a plurality of electromagnets that form a magnetic field generator with cooling tubes in accordance with some embodiments of the present principles.

In some embodiments, the first electromagnet 1208C may be positioned radially outward of the second electromagnet 1208D such that a space is formed between the first electromagnet 1208C and the second electromagnet 1208D to allow for at least one optional cooling tube 1210 to be inserted in between. The at least one optional cooling tube 1210 is fluidly connected to an optional heat exchanger 1206. The at least one optional cooling tube 1210 maintains the operating temperature of the first electromagnet 1208C and the second electromagnet 1208D to provide optimal magnetic field generation for influencing the ion trajectories onto the substrate 106. FIG. 13 depicts an isometric view of a portion 1300 of a plurality of electromagnets 1302 that forms a magnetic field generator with cooling tubes 1304 in accordance with some embodiments. The cooling tubes 1304 are positioned between the plurality of electromagnets 1302 to allow heat transfer from the windings of the plurality of electromagnets 1302 to the cooling fluid flowing in the cooling tubes 1304. In some embodiments, heat transfer material (not shown) may be used to fill any gaps between the cooling tubes 1304 and the windings to from a stronger heat transfer path between the windings and the cooling tubes 1304.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for influencing ion trajectories onto a substrate, comprising:
   at least one annular support assembly configured to be externally attached to and positioned below a substrate support pedestal in a vacuum space of a process chamber; and
   a magnetic field generator affixed to the at least one annular support assembly that is configured to radiate magnetic fields on a top surface of the substrate and configured to influence angles of incidence of ions impinging on the substrate during plasma vapor deposition processes, wherein the at least one annular support assembly includes a top annular plate, a middle annular plate with a plurality of openings, and a bottom annular plate and wherein the magnetic field generator includes a plurality of discrete permanent magnets positioned within the plurality of openings of the middle annular plate and held in place by the top annular plate and the bottom annular plate, and
   wherein at least one discrete permanent magnet of the plurality of discrete permanent magnets extends longitudinally between the top annular plate and the bottom annular plate along a longitudinal axis,
   wherein the longitudinal axis is angled at a non-zero angle up to 30 degrees with respect to a vertical axis extending between the top annular plate and the bottom annular plate.

2. The apparatus of claim 1, wherein the at least one discrete permanent magnet of the plurality of discrete permanent magnets is angled so that an upper end of the at least one discrete permanent magnet is disposed radially inwardly of a lower end of the at least one discrete permanent magnet.

3. The apparatus of claim 1, wherein the vertical axis is not parallel to the longitudinal axis.

4. The apparatus of claim 1, wherein the plurality of discrete permanent magnets is configured to operate at temperatures up of at least 200 degrees Celsius or higher without a loss of magnetic field strength.

5. The apparatus of claim 4, wherein at least one discrete permanent magnet of the plurality of discrete permanent magnets is formed of a samarium cobalt material having a maximum energy product of at least 30 MGOe.

6. The apparatus of claim 4, wherein the plurality of discrete permanent magnets includes 9 discrete permanent magnets spaced symmetrically apart in the at least one annular support assembly.

7. The apparatus of claim 1, wherein the magnetic field generator includes at least one electromagnet affixed to the at least one annular support assembly.

8. An apparatus for influencing ion trajectories onto a substrate, comprising:
   at least one arcuate support assembly configured to be externally attached to and positioned below a substrate support pedestal in a vacuum space of a process chamber; and
   a magnetic field generator affixed to the at least one arcuate support assembly that is configured to radiate magnetic fields on a top surface of the substrate and configured to influence angles of incidence of ions impinging on the substrate during plasma vapor deposition processes, wherein the at least one arcuate support assembly includes a top arcuate plate, a middle arcuate plate with a plurality of openings, and a bottom arcuate plate, and wherein the magnetic field generator includes a plurality of discrete permanent magnets positioned within the plurality of openings of the middle arcuate plate and held in place by the top arcuate plate and the bottom arcuate plate, wherein at least one discrete permanent magnet of the plurality of discrete permanent magnets extends longitudinally between the top arcuate plate and the bottom arcuate plate along a longitudinal axis extending between the top arcuate plate and the bottom arcuate plate, and wherein the longitudinal axis is angled at a non-zero angle up to 30 degrees with respect to a vertical axis extending between the top arcuate plate and the bottom arcuate plate.

9. The apparatus of claim 8, wherein the at least one arcuate support assembly includes a plurality of arcuate support assemblies arranged as an annular support assembly.

10. The apparatus of claim 8, wherein the at least one discrete permanent magnet of the plurality of discrete permanent magnets is angled so that an upper end of the at least one discrete permanent magnet is disposed radially inwardly of a lower end of the at least one discrete permanent magnet.

11. The apparatus of claim 8, wherein the vertical axis is not parallel to the longitudinal axis.

12. The apparatus of claim 8, wherein the plurality of discrete permanent magnets is configured to operate at temperatures up of at least 200 degrees Celsius or higher without a loss of magnetic field strength.

13. The apparatus of claim 12, wherein at least one discrete permanent magnet of the plurality of discrete permanent magnets is formed of a samarium cobalt material having a maximum energy product of at least 30 MGOe.

14. An apparatus for influencing ion trajectories onto a substrate, comprising:
   at least one support assembly configured to be externally attached to and positioned below a substrate support pedestal in a vacuum space of a process chamber; and
   a magnetic field generator affixed to the at least one support assembly that is configured to radiate magnetic fields on a top surface of the substrate and configured to influence angles of incidence of ions impinging on the substrate during plasma vapor deposition processes, wherein the support assembly includes a top plate, a middle plate with a plurality of openings, and a bottom plate, and wherein the magnetic field generator includes a plurality of discrete permanent magnets positioned within the plurality of openings of the middle plate and held in place by the top plate and the bottom plate, wherein at least one discrete permanent magnet of the plurality of discrete permanent magnets extends longitudinally between the top plate and the bottom plate along a longitudinal axis extending between the top plate and the bottom plate,
   wherein the longitudinal axis is angled at a non-zero angle up to 30 degrees with respect to a vertical axis extending between the top plate and the bottom plate.

15. The apparatus of claim 14, wherein the at least one discrete permanent magnet of the plurality of discrete permanent magnets is angled so that an upper end of the at least one discrete permanent magnet is disposed radially inwardly of a lower end of the at least one discrete permanent magnet.

16. The apparatus of claim 14, wherein longitudinal axis is not parallel with the vertical axis.

* * * * *